United States Patent
Kim et al.

(10) Patent No.: US 8,334,853 B2
(45) Date of Patent: Dec. 18, 2012

(54) LIGHT SENSOR CIRCUIT AND DRIVING METHOD THEREOF AND TOUCH SCREEN PANEL HAVING THE SAME

(75) Inventors: Do-Youb Kim, Yongin (KR); Yong-Sung Park, Yongin (KR); Deok-Young Choi, Yongin (KR); Soon-Sung Ahn, Yongin (KR); In-Ho Choi, Yongin (KR); Tae-Jin Kim, Yongin (KR); Joo-Hyeon Jeong, Yongin (KR); Brent Jang, Yongin (KR); Ki-Ju Im, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 208 days.

(21) Appl. No.: 12/662,987

(22) Filed: May 14, 2010

(65) Prior Publication Data

US 2011/0050600 A1    Mar. 3, 2011

(30) Foreign Application Priority Data

Sep. 2, 2009    (KR) .................. 10-2009-0082447

(51) Int. Cl.
*G06F 3/042*    (2006.01)
(52) U.S. Cl. .................. 345/175; 345/207; 178/18.09
(58) Field of Classification Search .................. 345/104, 345/207, 173–178; 178/18.01–18.09, 18.11
See application file for complete search history.

(56) References Cited

U.S. PATENT DOCUMENTS

| | | | |
|---|---|---|---|
| 6,512,543 B1 | 1/2003 | Kuroda et al. | |
| 2005/0258337 A1 | 11/2005 | Ozawa | |
| 2006/0250330 A1* | 11/2006 | Fish | 345/76 |
| 2007/0146516 A1 | 6/2007 | Nezaki et al. | |
| 2008/0158137 A1 | 7/2008 | Yoshida | |

FOREIGN PATENT DOCUMENTS

| | | | |
|---|---|---|---|
| GB | 2439098 A | * | 12/2007 |
| GB | 2439118 A | | 12/2007 |
| JP | 10-257392 A | | 9/1998 |
| JP | 2005-340265 A | | 12/2005 |
| KR | 10 2006-0049286 A | | 5/2006 |
| KR | 10-2007-0063451 A | | 6/2007 |
| KR | 10-2007-0069873 A | | 7/2007 |
| KR | 10-2008-0063198 A | | 3/2008 |
| KR | 10 2008-0048736 A | | 6/2008 |
| KR | 10 2009-0009387 A | | 1/2009 |
| WO | WO 2007-145346 | | 12/2007 |
| WO | WO 2009/025223 A1 | | 2/2009 |

OTHER PUBLICATIONS

European Search Report in EP 10174788.9-2205, dated Nov. 30, 2010 (Kim, et al.), European Search Report from prosecution of corresponding European application.
Japanese Office action for JP 2009-266272 dated May 22, 2012 (Kim, et al.).

* cited by examiner

*Primary Examiner* — Stephen Sherman
(74) *Attorney, Agent, or Firm* — Lee & Morse, P.C.

(57) ABSTRACT

A light sensor circuit, includes a light receiving element coupled to a first power supply, a capacitor coupled between the light receiving element and a second power supply, a first transistor including a gate electrode coupled to a first electrode of the capacitor, and a second transistor including a gate electrode coupled to a selection signal line, wherein the first transistor is coupled between the selection signal line and a first electrode of the second transistor, and the second transistor is coupled between a second electrode of the first transistor and an output signal line.

19 Claims, 4 Drawing Sheets

LIGHT SENSOR CIRCUIT AND DRIVING METHOD THEREOF AND TOUCH SCREEN PANEL HAVING THE SAME

BACKGROUND

1. Field

Embodiments relate to light sensor circuits, driving methods thereof, and light sensitive type touch screen panels employing a light sensor circuit as a sensor cell.

2. Description of the Related Art

Flat panel display devices include, e.g., organic light emitting display devices, liquid crystal display devices, plasma, display devices, field emission display devices, etc. In general, flat panel display devices are advantageous relative to conventional cathode ray tube (CRT) devices.

More particularly, in general, flat panel display devices are thinner in thickness, lighter in weight, and adapted to consume less power than the conventional CRT devices. Flat panel display devices, e.g., organic light emitting display devices or liquid crystal display devices, may also be employed in portable electronic equipment as they may be easily manufactured in a small size and/or may be employed for a relatively long time with battery power.

More particularly, many devices may employ a touch screen panel by which a user may input his or her instruction by selecting among instruction contents displayed on the screen of the flat panel display device using, e.g., a human hand or an object. The touch screen panel may be provided on a front face of the flat panel display device and may serve to convert a contact position directly contacted by human hand or the object into electrical signals so that the instruction contents selected at the contact position may be accepted as input signals.

A separate input device, such as a keyboard and/or mouse, which may generally be coupled to the flat panel display device, may be replaced by a touch screen panel that may be adapted to carry out additional functions. There are various types of touch screen panels, e.g., resistive type panels, capacitive type panels, light sensitive type panels.

Resistive type panels may operate based on a resistive connection between transparent conductive films that are arranged between two substrates. Such resistive type panels may be advantageous in that they are relatively easy to implement, but may be disadvantages in that mechanical and environmental reliability may be relatively low.

Capacitive type panels may determine a contact position of by sensing fine current flowing between a sensor electrode and a finger according to a change in capacitance. Such capacitive technology may be disadvantageous in that it may be more vulnerable to noise signals.

Light sensitive type panels do not employ a film, etc., and may fundamentally recognize a touch based on, e.g., high transmittance. Further, maintenance of the transmittance and brightness of the display device may be important factors for providing high quality devices.

However, more devices and/or methods adapted for more precise light sensing may be advantageous and/or required in order to implement the light sensitive type touch screen panel as described above.

SUMMARY

Embodiments are therefore directed to light sensing circuits, driving methods thereof, and light sensitive type touch screen panels employing such light sensor circuits, which substantially overcome one or more of the problems due to the limitations and disadvantages of the related art.

It is therefore a feature of an embodiment to provide a light sensor circuit that may more exactly sense a degree of light change by maximizing a light receiving region of a light receiving element and by minimizing a number of power lines and signal lines in implementing the light sensor circuit.

It is therefore a separate feature of an embodiment to provide a driving method thereof for a touch screen panel including a light sensor circuit that may more precisely sense a degree of light change by maximizing a light receiving region of a light receiving element and by minimizing a number of power lines and signal lines in implementing the light sensor circuit.

It is therefore a separate feature of an embodiment to provide a touch screen panel including a light sensor circuit that may improve sensitivity of the touch screen panel by maximizing a light receiving region of a light receiving element provided in each sensor cell.

At least one of the above and other features and advantages may be realized by providing a light sensor circuit, including a light receiving element coupled to a first power supply, a capacitor coupled between the light receiving element and a second power supply, a first transistor including a gate electrode coupled to a first electrode of the capacitor, and a second transistor including a gate electrode coupled to a selection signal line, wherein the first transistor is coupled between the selection signal line and a first electrode of the second transistor, and the second transistor is coupled between a second electrode of the first transistor and an output signal line.

The light sensor circuit may include a third transistor including a gate electrode coupled to an initialization power supply, the third transistor may be coupled between the second power supply and the output signal line.

The light receiving element may be a PIN diode, a PN diode or a photo coupler, having a cathode that may be coupled to the first electrode of the capacitor and an anode that may be coupled to the first power supply.

The capacitor may include a second electrode coupled to the second power supply, and the first electrode of the capacitor may be coupled to a cathode of the light receiving element and the gate electrode of the first transistor.

The second transistor may include a second electrode coupled to the output signal line corresponding to an output terminal.

The second transistor may be an N-type transistor, and the first electrode of the second transistor may correspond to a source electrode and the second electrode of the second transistor may correspond to a drain electrode.

The third transistor may include a first electrode coupled to the second power supply and a second electrode coupled to the output signal line corresponding to an output terminal.

The third transistor may be an N-type transistor, and the first electrode of the third transistor may correspond to a source electrode and the second electrode of the third transistor corresponds to a drain electrode.

The second power supply may be adapted to supply a low-level voltage or a ground voltage.

The first transistor may include a first electrode coupled to the selection signal line.

The first transistor may be an N-type transistor, and the first electrode of the first transistor may correspond to a drain electrode and the second electrode of the first transistor may correspond to a source electrode.

The first transistor may be a P-type transistor, and the first electrode of the first transistor may correspond to a source electrode and the second electrode of the first transistor may correspond to a drain electrode.

The first transistor may include a first electrode coupled to a selection signal line and the gate electrode of the second transistor, wherein a selection signal applied to the selection signal line may be adapted to simultaneously be a power voltage to be applied to the first electrode of the first transistor and a control signal to be applied to the gate of the second transistor to control an ON/OFF state of the second transistor.

The first power supply may be adapted to alternately apply a high-level voltage and a low-level voltage, wherein when the high-level voltage is applied, the light receiving element is in a forward bias state and when the low-level voltage is applied, the light receiving element is in a reverse bias state.

At least one of the above and other features and advantages may be realized by providing a driving method for driving a light sensor circuit, the method including during a first period of a frame period, applying a first power signal at a high level voltage state thereof to an anode electrode of a light receiving element to store a voltage corresponding to the applied first power signal in a capacitor and initializing a gate electrode of a first transistor based on the voltage of the applied first power signal, during a second period of the frame period, applying the first power signal at a low-level voltage state thereof to the anode electrode of the light receiving element and discharging the voltage stored in the capacitor based on a voltage applied to the gate electrode of the first transistor based on light leakage current generated according to an amount of light incident on the light receiving element, and during a third period of the frame period, applying a selection signal having a high level voltage to a selection signal line, the selection signal line being coupled to a first electrode of the first transistor and a second transistor, the second transistor being coupled between a second electrode of the first transistor and an output signal line, and finally outputting an output signal having a voltage value based the amount of light incident on the light receiving element.

The method may further include maintaining, during a first period of a Kth frame, a final voltage of the output signal of the third period of a (K−1)th frame and performing a sampling process based on the final voltage.

Among the first period, the second period, and the third period of one frame, the second period of the frame may be implemented to be a longest in time.

The method may further include applying, during a specific period of the second period, a high-level initialization power to a gate electrode of a third transistor to turn on the third transistor and initialize a voltage of an output terminal based on a voltage of a second power supply.

A first electrode of the first transistor may be coupled to the selection signal line and a gate electrode of the second transistor, wherein a selection signal applied to the selection signal line may be adapted to simultaneously be a power voltage to be applied to the first electrode of the first transistor and a control signal to be applied to the gate of the second transistor to control an ON/OFF state of the second transistor.

At least one of the above and other features and advantages may be realized by providing a touch screen panel, including a plurality of selection signal lines that extend along a first direction, a plurality of output signal lines that extend along a second direction, the first direction crossing with the second direction, and a plurality of sensor cells that are arranged in respective regions defined by respective portions of the selection signal lines and the output signal lines, each of the sensor cells being coupled to respective ones of the selection signal lines and the output signal lines, wherein each of the sensor cells may include a light receiving element coupled to a first power supply, a capacitor coupled between the light receiving element and a second power supply, a first transistor including a gate electrode coupled to a first electrode of the capacitor, and a second transistor including a gate electrode coupled to a selection signal line, wherein the first transistor may be coupled between the selection signal line and a first electrode of the second transistor, and the second transistor may be coupled between a second electrode of the first transistor and an output signal line.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
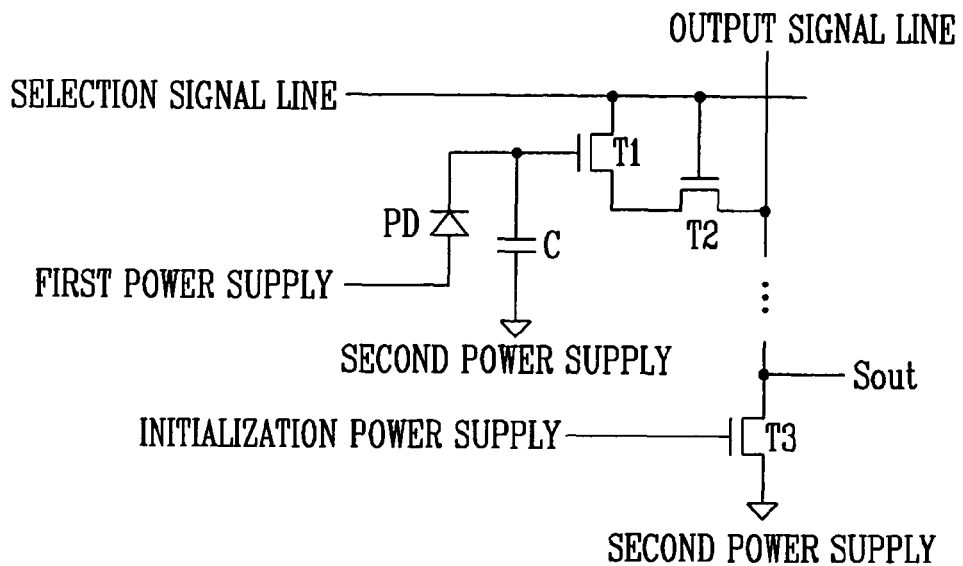
FIG. 1 illustrates a circuit diagram of an exemplary embodiment of a light sensor circuit.

Korean Patent Application No. 10-2009-0082447, filed on Sep. 2, 2009, in the Korean Intellectual Property Office, and entitled: "Light Sensor Circuit and Driving Method Thereof and Touch Screen Panel Having the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, when an element is referred to as being coupled to another element, unless specified otherwise, it may be directly coupled or indirectly coupled via one or more other intervening elements to the other element. In addition, it will also be understood that when an element is referred to as being "between" two elements, it may be the only element between the two elements, or one or more intervening elements may also be present. Like reference numerals refer to like elements throughout.

FIG. 1 illustrates a circuit diagram of an exemplary embodiment of a light sensor circuit. Referring to FIG. 1, the light sensor circuit may include a light receiving element PD, a capacitor C, a first transistor T1, a second transistor T2, and a third transistor T3.

The light receiving element PD may be coupled between a first power supply and a first electrode of the capacitor C. Current corresponding to a change in light received by the light receiving element PD may flow through the light receiving element PD, and may thereby allow the capacitor C to be discharged to a predetermined voltage.

More particularly, a cathode of the light receiving element PD may be coupled to the first electrode of the capacitor C, and an anode of the light receiving element PD may be coupled to the first power supply. The light receiving element PD may be, e.g., a PIN diode (p-type semiconductor/intrinsic semiconductor/n-type semiconductor diode), a PN diode (p-type semiconductor/n-type semiconductor diode), a photo coupler, etc. It should be understood that embodiments of the light receiving element PD are not limited to such types and/or materials.

Referring to FIG. 1, the first electrode of the capacitor C may be coupled to the cathode of the light receiving element PD and a gate electrode of the first transistor T1. A second electrode of the capacitor C may be coupled to a second power supply. The capacitor C may thereby serve to store a voltage applied to the gate electrode of the first transistor T1.

The second power supply may supply a low-level voltage, e.g., ground voltage GND.

A first electrode and a second electrode of the first transistor T1 may be coupled to a selection signal line and a first electrode of the second transistor T2, respectively. As discussed above, the gate electrode of the first transistor T1 may be coupled to the cathode of the light receiving element PD and the first electrode of the capacitor C.

The first transistor T1 may be an N-type transistor. In such embodiments, the first transistor T1 may operate in a source follower scheme. The first electrode of the first transistor T1 coupled to the selection signal line may correspond to a drain electrode and the second electrode coupled to a first electrode of the second transistor T2 may correspond to a source electrode.

The second transistor T2 may include a gate electrode, which may be coupled to the selection signal line. As discussed above, the first electrode of the second transistor T2 may be coupled to the second electrode of the first transistor T1. The second electrode of the second transistor T2 may be coupled to an output signal line and an output terminal Sout.

The second transistor T2 may be an N-type transistor. The second transistor T2 may function as a switching element.

The third transistor T3 may include a gate electrode, and first and second electrodes. The gate electrode of the third transistor T3 may be coupled to an initialization power supply, the second electrode of the third transistor T3 may be coupled to the second power supply, and the second electrode of the third transistor T3 may be coupled to the output signal line and the output terminal Sout.

The third transistor T3 may be an N-type transistor. The third transistor T3 may function as a switching element.

In embodiments, each of the first, second, and third transistors T1, T2, and T3 may be, e.g., a poly silicon thin film transistor, an amorphous silicon thin film transistor, an organic thin film transistor, etc. It should be understood that embodiments of the first, second and third transistors T1, T2, T3 are not limited to such transistor types and/or material. For example, while the first, second, and third transistors T1, T2, and T3 are illustrated in FIG. 1 as N-type transistors, in some embodiments one, some or all of the transistors may be implemented as P-type transistors.

Figure 2:
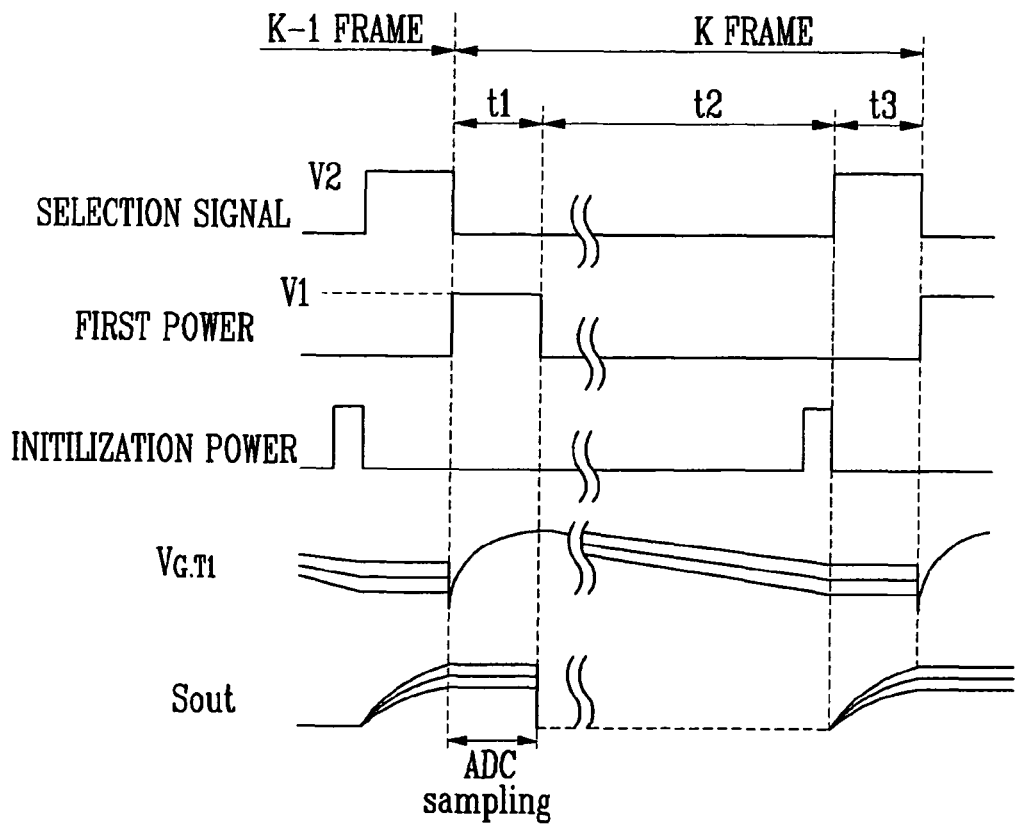
FIG. 2 illustrates a timing diagram of exemplary signals employable for operating the light sensor circuit of FIG. 1.

FIG. 2 illustrates a timing diagram of exemplary signals employable for operating the light sensor circuit of FIG. 1.

An exemplary operation of the light sensor circuit will be described with reference to FIGS. 1 and 2. As shown in FIG. 2, an exemplary period of operation of the light sensor circuit of FIG. 1 may include a first period t1, a second period t2, and a third period t3.

Referring to FIGS. 1 and 2, during the first period t1, a gate voltage $V_{G.T1}$ of the first transistor T1 may be initialized. During the second period t2, a change in amount of light received by the light receiving element PD may be sensed. During the third period t3, a voltage value corresponding to a change in the light sensed by the light receiving element PD may be output through the output terminal Sout.

Referring to FIG. 2, a final voltage value output during a third period t3 of a frame, e.g., K−1 frame, may be maintained during the first period t1 of a next frame, e.g., K frame. Thus, during the second period t2 of the next frame (K frame), a sampling process based on the final voltage value output during the third period t3 of the previous frame (K−1 frame), may be performed. A change in voltage value based on an amount of light sensed during the second period t2 of the previous frame (K−1 frame) and an amount of light sensed during the second period t2 of the current frame (K frame) may be transferred to an analog-digital converter ADC (not shown) through the output terminal Sout and may be converted into a digital value.

Referring to FIG. 2, a first power, an initialization power, and a selection signal may be applied to the light sensor circuit, e.g., exemplary light sensor circuit of FIG. 1, during the first, second, and third periods t1, t2, and t3, respectively, in order to perform the operations as described above.

In embodiments, among the first, second, and third periods t1, t2, and t3 of a respective frame, the second period t2 may be implemented to be longest. By increasing and/or maximizing a sensing period, e.g., the second period t2, and/or reducing and/or minimizing non-sensing periods, e.g., the initialization period t1 and/or output period t3, light sensing efficiency and/or accuracy may be improved.

Referring to FIGS. 1 and 2, during a frame, e.g., K-frame, during the first period t1, the first power may be at a high level V1 state. As discussed above, the first power may be applied to the anode electrode of the light receiving element PD. If the first power having the high level V1 is applied as described above, the light receiving element PD may operate in a forward bias state so that a voltage V1-$V_{f.PD}$ (forward threshold voltage of the light receiving element PD) may be applied to the gate electrode of the first transistor T1 coupled to the cathode electrode of the light receiving element. The capacitor C may be provided between the cathode electrode of the light receiving element PD and the second power supply (for example, GND) may be charged with a voltage corresponding to the voltage V1-$V_{f.PD}$, which may be applied to the gate electrode of the first transistor T1.

More particularly, during the first period t1, the high-level first power V1 may serve to initialize the gate electrode of the first transistor T1 coupled to the anode electrode of the light receiving element PD. The gate voltage $V_{G.T1}$ of the first transistor T1 may be gradually increased during the first period t1. Referring to FIG. 2, the gate voltage $V_{G.T1}$ of the first transistor T1 may have a voltage equal to and/or corresponding to the voltage V1-$V_{f.PD}$ during a latter part and/or at an end of the first period t1.

Referring still to FIGS. 1 and 2, during the first period t1, the selection signal applied to the selection signal line may be at a low level state. More particularly, in embodiments in which the second transistor T2 is an N-type transistor, during the first period t1, if the selection signal applied is at a low level state, the second transistor T2 may be in an OFF state.

During the second period t2, the first power may be at a low level state, and the light receiving element PD may operate in a reverse bias state.

In such embodiments, as a result of light leakage current generated based on an amount of light incident on the light receiving element PD, the gate voltage $V_{G.T1}$ of the first transistor T1, i.e., voltage charged in the capacitor C, may be discharged based on the light leakage current. In the description of exemplary embodiments, the voltage discharged corresponding to the light leakage current is referred to as ΔV.

More particularly, e.g., the capacitor C may be discharged in proportion to the amount of light incident on the light receiving element PD. Therefore, constant current may flow from the capacitor C, via the light receiving element PD, to the first power supply at a low level state. In general, when the incident light is relatively bright, an amount of current through the light receiving element PD may be relatively large, and when the incident light is relatively dark and/or low, an amount of current flow through the light receiving element PD may be relatively small.

Referring to FIGS. 1 and 2, during the second period t2, the gate voltage $V_{G.T1}$ of the first transistor T1, e.g., voltage stored in the capacitor C, may be gradually decreased. During the latter part of the second period t2, e.g., at the end of the second period t2, a voltage of the gate voltage $V_{G.T1}$ of the first transistor T1, e.g., voltage stored in the capacitor C, may correspond to $V1-V_{f.PD}-\Delta V$.

During the second period t2, the initialization power signal may include a high level pulse, e.g., be at a high level for a predetermined period. The initialization power signal may be applied to the gate electrode of the third transistor T3. In embodiments in which the third transistor T3 is an N-type transistor, if the initialization power signal at a high level is applied to the gate electrode of the third transistor T3, the third transistor T3 may be turned on. As a result, a voltage of the output terminal Sout may be initialized to a voltage of the second power supply, e.g., ground. More particularly, the output terminal Sout may be initialized via a current path between the second power supply, through the third transistor T3 to the first electrode of the third transistor T3 corresponding to output terminal Sout.

In the exemplary embodiment of FIG. 2, the initialization power signal has a high level state toward the end of the second period t2. However, embodiments are not limited thereto. That is, e.g., the output terminal Sout may be initialized at the beginning or middle of the second period.

Referring to FIGS. 1 and 2, during the third period T3, the selection signal at a high level state may be applied to the selection signal line. That is, e.g., in some embodiments, after the voltage of the output terminal Sout is initialized during the second period t2, the selection signal at a high level state may be applied to the selection signal line. In embodiments in which the second transistor T2 is an N-type transistor, if the selection signal is at a high level, the second transistor T2 may be turned on.

More particularly, with regard to the first transistor T1, which may be implemented as an N-type transistor and may operate as a source follower, the first electrode thereof, which may be coupled to the selection signal line to which the selection signal at the high level is applied, may correspond to a drain electrode and the second electrode thereof, which may be coupled to the first electrode of the second transistor T2, may correspond to a source electrode.

When the second transistor T2 is turned on during the third period t3, the source electrode, e.g., second electrode, of the first transistor T1 may be coupled, via the second transistor T2, to the output terminal Sout, which may have been previously initialized, e.g., during the second period t2, to the voltage of the second power supply, e.g., ground voltage. As a result, the first transistor T1 may be turned on. In such embodiments, e.g., a voltage applied to the gate electrode of the first transistor T1, e.g., $V1-V_{f.PD}-\Delta V$, may be higher than the voltage, e.g., ground voltage, at the source electrode, e.g., the second electrode of the first transistor T2. More particularly, the selection signal applied to the selection signal line may also be applied to the first electrode of the first transistor T1. Thus, embodiments may eliminate a need for a separate line for supplying a voltage to, e.g., the first electrode of the first transistor T1.

More particularly, the first transistor T1 may operate in a source follower mode and the voltage at the source electrode thereof may be gradually raised by the voltage of the gate electrode, that is, by the voltage of $V1-V_{f.PD}-\Delta V-V_{T1.th}$ (threshold voltage of the first transistor T1). The first transistor T1 may be turned off when the voltage of the source electrode reaches $V1-V_{f.PD}-\Delta V-V_{T1.th}$.

Therefore, as shown in FIG. 2, the voltage of the output terminal Sout coupled to the source electrode of the first transistor T1 may be gradually raised to $V1-V_{f.PD}-\Delta V-V_{T1.th}$ from the ground voltage.

Thereafter, if the selection signal is changed from a high-level state to a low-level state, the second transistor T2 may be turned off. If the second transistor T2 is turned off, a path between the source electrode of the first transistor T1 and the output terminal Sout may be disconnected. As a result, a voltage of the output terminal Sout, which may have gradually been raised during the third period t3 of the previous frame, e.g., K−1 frame, may be maintained at $V1-V_{f.PD}-\Delta V-V_{T1.th}$.

More particularly, e.g., in some embodiments, the final voltage $V1-V_{f.PD}-\Delta V-V_{T1.th}$ output during the third period t3 of a previous frame, e.g., K−1 frame, may be maintained during the first period t1 of the current frame K frame. Thus, a sampling process based on the final voltage value of the previous frame K−1 may be performed. More particularly, in embodiments, e.g., an amount of change in voltage corresponding to a change in an amount of light sensed relative to the second period t2 of the previous frame K−1 frame may be transferred to the analog digital converter ADC (not shown) through the output terminal Sout and may be converted into a digital value.

In general, when a relatively small amount of light is incident on the light receiving element PD, an amount of discharge of the capacitor C may be relatively small and $\Delta V$ may be relatively small. In such embodiments, a magnitude of the final voltage value output through the output terminal Sout may be relatively large.

When a relatively large amount of light is incident on the light receiving element PD, an amount of discharge of the capacitor C may be relatively large and $\Delta V$ may be relatively large. In such embodiments, a magnitude of the final voltage value output through the output terminal Sout may be relatively small.

Embodiments may provide a light sensor circuit, e.g., light sensor circuit described above with reference to FIGS. 1 and 2, in which a final voltage value output from an output terminal thereof, e.g., Sout, may be changed based on a amount of light incident on a light receiving element PD such that a change in an amount of incident light may be sensed.

In some embodiments, the selection signal applied to the selection signal line may be used as the signal for controlling an ON/OFF state of the second transistor T2 and for supplying a voltage to the first electrode of the first transistor T1. Thus, by employing the selection signal line, which may be used for supplying the selection signal, to also supply power to the first electrode of the first transistor T1, embodiments may enable a number of power lines to be reduced. As a result, embodiments may also enable a light receiving region of the light receiving element to be increased and/or maximized. By increasing and/or maximizing the light receiving region, embodiments may enable a change in an amount of incident light may be more precisely sensed.

Figure 3:
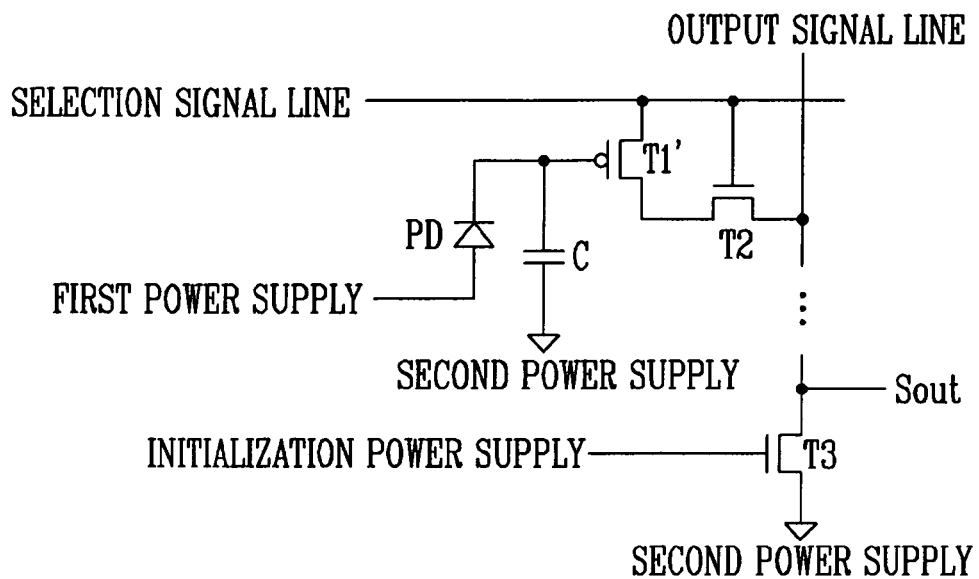
FIG. 3 illustrates a circuit diagram of another exemplary embodiment of a light sensor circuit.
Figure 4:
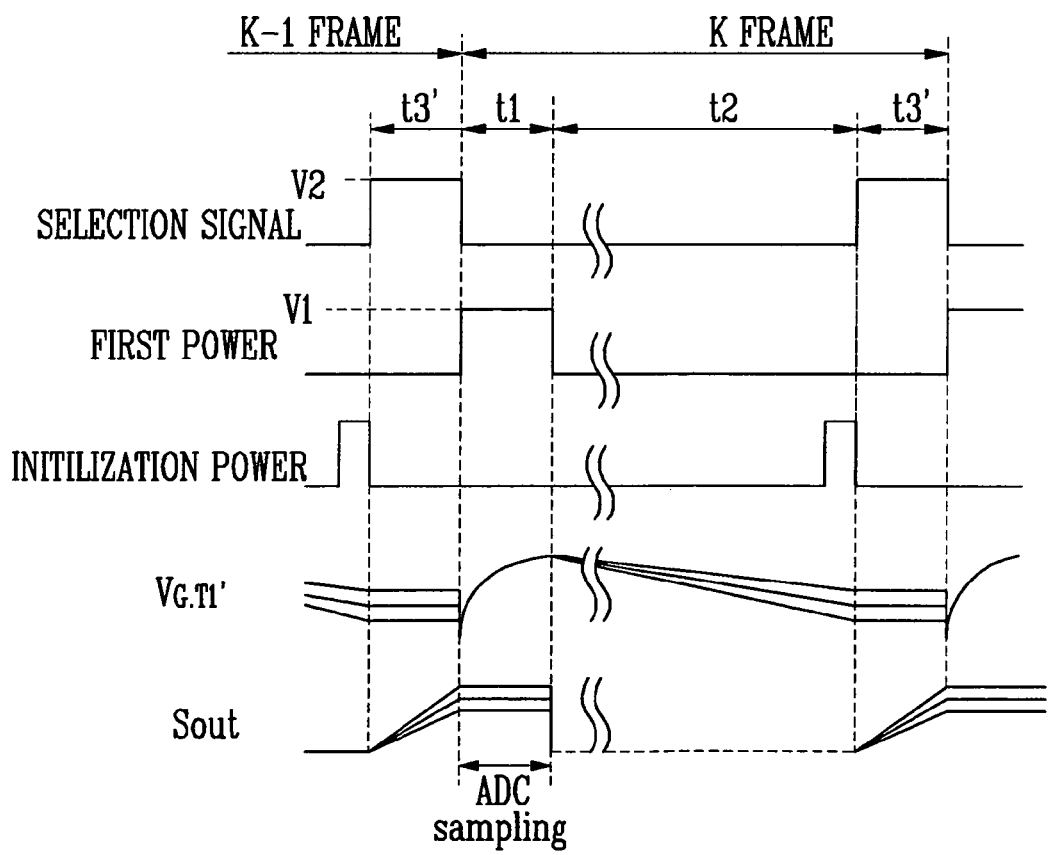
FIG. 4 illustrates a timing diagram of exemplary signals employable for operating the light sensor circuit of FIG. 3.

FIG. 3 illustrates a circuit diagram of another exemplary embodiment of a light sensor circuit. FIG. 4 illustrates a timing diagram of exemplary signals employable for operating the light sensor circuit of FIG. 3. The exemplary light sensor circuit of FIG. 3 and the exemplary signals of FIG. 4 substantially correspond to the exemplary light sensor circuit of FIG. 1 and the exemplary signals of FIG. 2, respectively. Thus, in general, only differences between the exemplary light sensor circuits of FIGS. 1 and 3 and the exemplary signals of FIGS. 2 and 4 will be described below.

More particularly, referring to FIG. 3, the light sensor circuit of FIG. 3 substantially corresponds to the light sensor circuit of FIG. 1, except that a first transistor T1' of the light sensor circuit of FIG. 3 is implemented in a P-type, whereas the first transistor T1 of the light sensor circuit of FIG. 1 is implemented as an N-type.

In the embodiment shown in FIG. 3, the first transistor T1' may operate as a current source. More particularly, a first electrode of the first transistor T1' may be coupled to the selection signal line and may correspond to a source electrode thereof. A second electrode of the first transistor T1' may be coupled to the first electrode of the second transistor T2 and may correspond to a drain electrode thereof.

Referring to FIGS. 2 and 4, during the first and second periods t1, t2, operation of the exemplary light sensor circuit of FIG. 3 and the exemplary light sensor circuit of FIG. 1 may be the same. With the first transistor T1' being implemented as a P-type transistor, operation of the exemplary light sensor circuit of FIG. 3 may be different during, e.g., a third period t3'.

Referring to FIG. 4, and as discussed above with regard to FIG. 2, during the second period t2, the initialization power signal may include a high level pulse that may turn on the third transistor T3. As a result, the output terminal Sout may be initialized to the voltage, e.g., ground voltage, of the second power supply. Then, during the third period t3, e.g., after the output terminal Sout is initialized, the second transistor T2, e.g., N-type transistor, may be turned on when a selection signal having a high level V2 is applied to the gate electrode thereof.

Referring to FIG. 4, the P-type first transistor T1' may be turned on when a voltage higher than a voltage applied to a gate electrode thereof is applied to the source electrode thereof. For example, when a voltage applied to the source electrode thereof is higher than the voltage $V1-V_{fPD}-(-\Delta V)$ applied to a gate electrode thereof, the first transistor T1' may be turned on.

The high-level voltage V2 of the selection signal may be larger than or equivalent to the high-level voltage V1 of the first power signal.

When the second transistor T2 is in an ON state, the drain electrode of the first transistor T1' may be coupled via the second transistor T2, to the output terminal Sout and the output signal line. More particularly, with the first transistor T1' and the second transistor T2 in an ON-state, a current path may be formed from the source electrode of the first transistor T1' to the output terminal Sout and the output signal line through the drain electrode of the first transistor T1' and the second transistor T2. As a result, a current corresponding to a voltage between the source and gate electrodes of the first transistor T1' may flow to the output terminal Sout. As such a current flows, as shown in FIG. 4, a final voltage at the output terminal may gradually increase.

In such embodiments, e.g., a current flowing to the output terminal Sout may have a magnitude corresponding to the voltage between the source and gate electrodes of the first transistor T1'. When a relatively small amount of light is incident on the light receiving element PD, an amount of discharge of the capacitor C may be relatively small and $\Delta V$ may be relatively small. Thus, a voltage between the source and gate may be relatively small. Thus, a magnitude of the current flow to the output terminal Sout may also be relatively small. In such embodiments, a magnitude of the final voltage value output through the output terminal Sout may be relatively small.

When a relatively large amount of light is incident on the light receiving element PD, an amount of discharge of the capacitor C may be relatively large and $\Delta V$ may be relatively large. Thus, a voltage between the source and gate may be relatively large and a magnitude of the current flow to the output terminal Sout may also be relatively large. In such embodiments, a magnitude of the final voltage value output through the output terminal Sout may be relatively large.

Referring to FIG. 4, the final voltage value output during the third period t3 of a previous frame, e.g., K−1 frame, may be maintained during the first period t1 of the current frame, e.g., K frame. Thus, a sampling process based on the final voltage value of the previous frame K−1 may be performed. More particularly, in embodiments, e.g., an amount of change in voltage corresponding to a change in an amount of light sensed relative to the second period t2 of the previous frame K−1 frame may be transferred to the analog digital converter ADC (not shown) through the output terminal Sout and may be converted into a digital value.

As described above, comparing the embodiment of FIGS. 3 and 4 with the embodiment of FIGS. 1 and 2, they are similar in view of the operation principle but are different in that the final voltage value output from the output terminal may change in proportion to the light incident on the light receiving element PD.

Figure 5A:
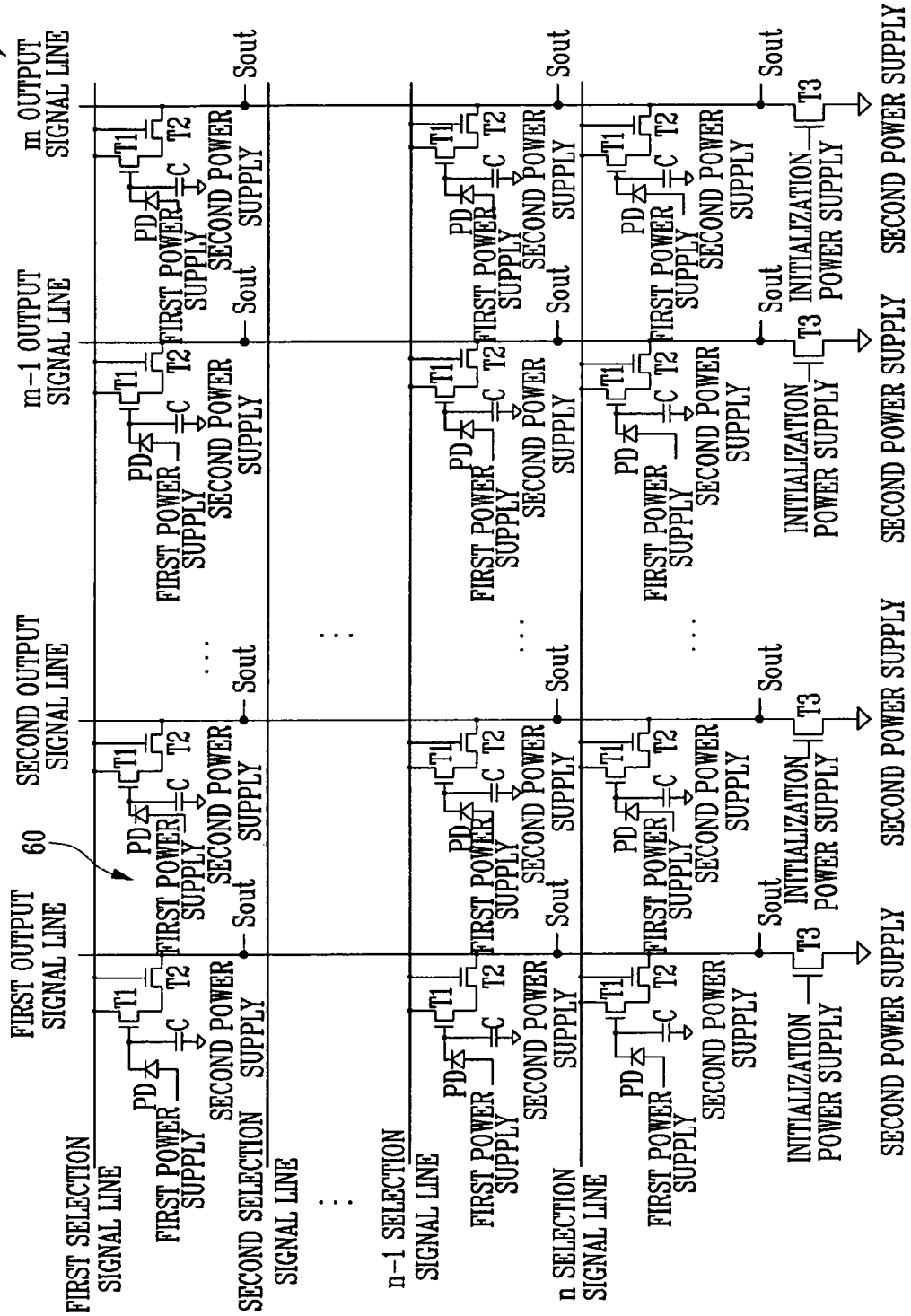
FIGS. 5A and 5B illustrate circuit diagrams of exemplary embodiments of a touch screen panel.
Figure 5B:
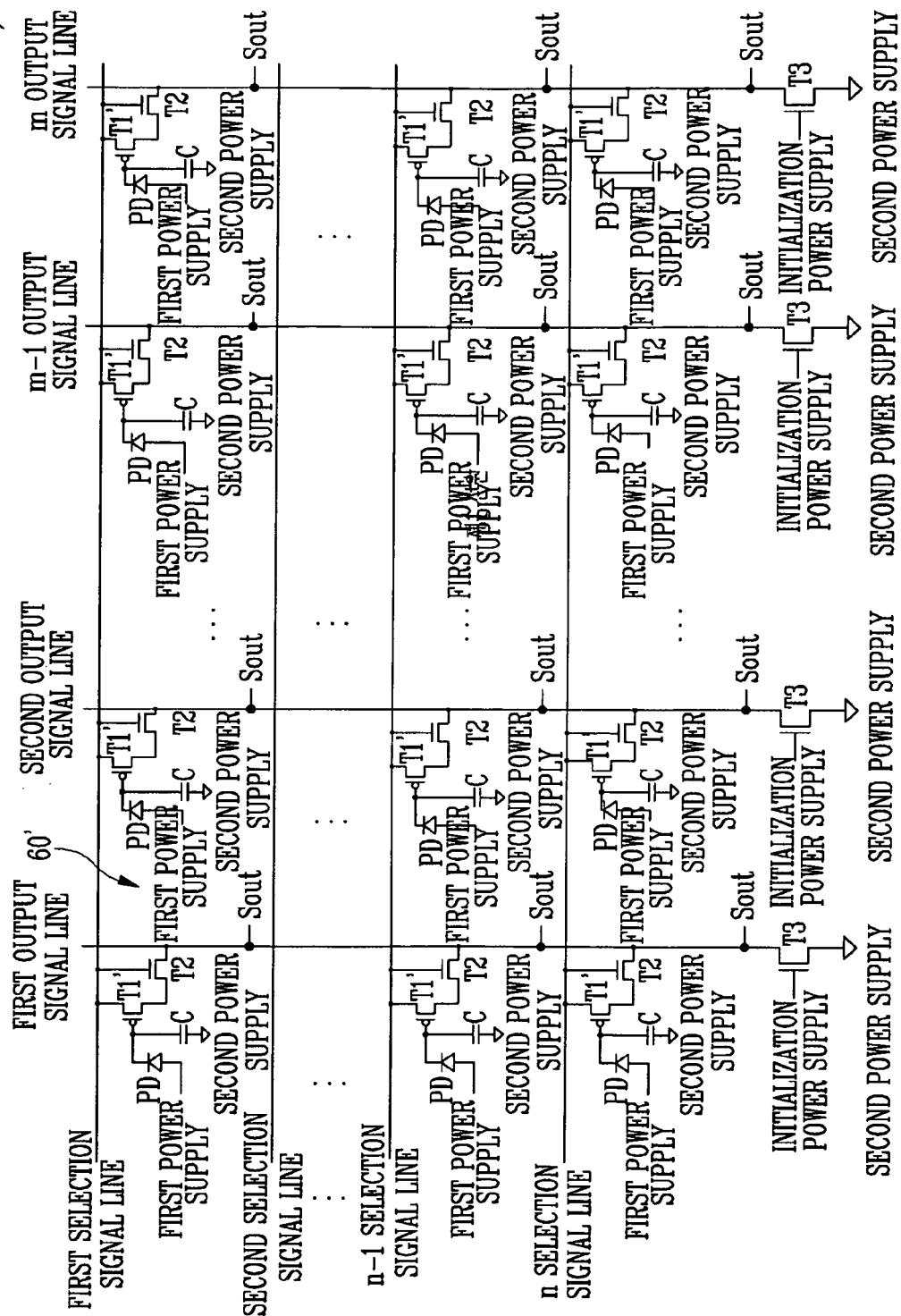

FIGS. 5A and 5B illustrate circuit diagrams of exemplary embodiments of a touch screen panel 50, 50'.

Referring to FIGS. 5A and 5B, the touch screen panels 50, 50' may include n selection signal lines arranged in a first direction, m output signal lines arranged in a second direction, and a plurality of sensor cells 60, 60'. The second direction may cross the first direction. Each of the sensor cells 60, 60' may correspond to regions defined by respective portions of the selection signal lines and the output lines. More particularly, each of the sensor cells 60, 60' may be coupled to respective ones of the selection signal lines and the output signal lines.

In embodiments, the sensor cells 60, 60' may be implemented as the light sensor circuits of FIGS. 1 and 3, respectively. More particularly, in the exemplary embodiments illustrated in FIGS. 5A and 5B, the sensor cells 60 of the touch screen panel 50 of FIG. 5A may correspond to the exemplary light sensor circuit of FIG. 1, and the sensor cells 60' of the touch screen panel 50' of FIG. 5B may correspond to the exemplary light sensor circuit of FIG. 3. Accordingly, exemplary light sensing operations of such exemplary sensor cells 60, 60' has already been explained above with reference to FIGS. 1-4.

More particularly, each of the sensor cells 60, 60' may include a light receiving element PD coupled to a first power supply, a capacitor C coupled between the light receiving element and a second power supply, a first transistor T1, T1', a second transistor T2 and a third transistor T3.

The first transistor T1, T1' may be coupled between a respective one of the selection signal lines and a first electrode of the second transistor T2. A gate electrode of the first transistor T1, T1' may be coupled to a first electrode of the capacitor C.

The second transistor T2 may be coupled between a second electrode of the first transistor T1, T1' and a respective one of the output signal lines. A gate electrode of the second transistor T2 may be coupled to the respective one of the selection signal lines.

The third transistor T3 may be coupled between the second power supply and the respective one of the output signal lines. A gate electrode of the third transistor T3 may be coupled to an initialization power supply.

In some embodiments, e.g., in the exemplary embodiment of FIGS. 1 and 5A, the first transistor T1 may be N-type and the first electrode of first transistor T1 may correspond to a drain electrode and the second electrode of the first transistor T1 may correspond to a source electrode. In such embodiments, the drain electrode may be coupled to the respective selection signal line and source electrode may be coupled to the first electrode of the second transistor T2.

In some embodiments, e.g., in the exemplary embodiment of FIGS. 3 and 5B, the first transistor T1' may be P-type and the first electrode of first transistor T1' may correspond to a source electrode and the second electrode of the first transistor T1' may correspond to a drain electrode. In such embodiments, the source electrode may be is coupled to the respective selection signal line and the drain electrode may be coupled to the first electrode of the second transistor T2.

Embodiments of a touch screen panel employing one or more features described herein, e.g., touch screen panels of FIGS. 5A and 5B, may include a light sensor circuit corresponding to sensor cells in each sensing region. In embodiments, the sensing regions may be arranged a matrix form. The sensing regions may be defined by respective portions of n selection signal lines and m output signal lines, wherein the n selection signal lines cross the m output signal lines.

If a user touches a panel on which the sensor cells are arranged, e.g., in a matrix form, using, e.g., a finger, etc., an intensity of light incident on the sensor cell positioned on the touched region may be changed and a voltage value output from the sensor cell may be detected based on the change of the light, and, as a result, a position of the user's touch may be determined.

More particularly, e.g., in some embodiments, if a user touches a specific region on a panel, a sensor cell positioned at the touched region may output a different voltage from a sensor cell positioned at another position of the panel that was not touched by the user. Thus, embodiments may enable the touched position of the panel to be determined.

In embodiments, high-level selection signals may be respectively applied to n selection signal lines. More particularly, in embodiments, such high level selection signals may be sequentially applied to the first to n selection signal lines during one frame period. The initialization power may also be sequentially applied, e.g., to the gate electrodes of the respective third transistors T3 during one frame period in accordance with the high-level selection signals. As such, e.g., during one frame period, the high-level first power and the initialization power may be sequentially applied to the light sensor circuits of the sensor cells associated with corresponding ones of the third transistors T3 and the n selection signal lines.

Therefore, a touch screen panel employing one or more of the features described herein may be adapted to determine a position touched per one frame period.

Embodiments may provide a touch screen panel that is attached to a front surface of a panel of a flat panel display device. Embodiments of light sensor circuits employing one or more features described herein may also be applied to a screen panel that is integrally formed with a flat panel display panel.

In some embodiments, selection signals may be sequentially applied to a plurality of selection signal lines during one frame period such that the selection signal lines and the selection signals in a manner that may correspond to scan lines and scan signals, respectively, of a flat panel display panel. In such embodiments, e.g., when a period of one frame for driving the touch screen panel is the same as a period of one frame for driving the flat panel display panel, the selection signals applied to the touch screen panel may correspond with the scan signals applied to the flat panel display panel.

For example, when the touch screen panel and the flat panel display panel are driven at, e.g., 120 Hz, the period of one frame may be the same so that the selection signals and the scan signals sequentially applied during the one frame period may be identically applied. Embodiments may provide a flat panel display including a touch screen panel in which selection signal lines of the touch screen panel may correspond to, e.g., be coupled to, scan lines of the display, and may enable the flat panel display panel and the touch screen panel to be integrally formed more simply.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A light sensor circuit, comprising:
a light receiving element coupled to a first power supply;
a capacitor coupled between the light receiving element and a second power supply;
a first transistor including a gate electrode coupled to a first electrode of the capacitor; and
a second transistor including a gate electrode coupled to a selection signal line, wherein:
the first transistor is coupled between the selection signal line and a first electrode of the second transistor, the selection signal line being directly coupled to a first electrode of the first transistor and the second transistor, and
the second transistor is coupled between a second electrode of the first transistor and an output signal line, wherein the capacitor includes a second electrode coupled to the second power supply, and the first electrode of the capacitor is coupled to a cathode of the light receiving element and the gate electrode of the first transistor.

2. The light sensor circuit as claimed in claim 1, further including a third transistor including a gate electrode coupled to an initialization power supply, the third transistor being coupled between the second power supply and the output signal line.

3. The light sensor circuit as claimed in claim 2, wherein the third transistor includes a first electrode coupled to the second power supply and a second electrode coupled to the output signal line corresponding to an output terminal.

4. The light sensor circuit as claimed in claim 3, wherein the third transistor is an N-type transistor, and the first electrode of the third transistor corresponds to a source electrode and the second electrode of the third transistor corresponds to a drain electrode.

5. The light sensor circuit as claimed in claim 1, wherein the light receiving element is a PIN diode, a PN diode or a photo coupler, having a cathode coupled to the first electrode of the capacitor and an anode coupled to the first power supply.

6. The light sensor circuit as claimed in claim 1, wherein the second transistor includes a second electrode coupled to the output signal line corresponding to an output terminal.

7. The light sensor circuit as claimed in claim 6, wherein the second transistor is an N-type transistor, and the first electrode of the second transistor corresponds to a source electrode and the second electrode of the second transistor corresponds to a drain electrode.

8. The light sensor circuit as claimed in claim 1, wherein the second power supply is adapted to supply a low-level voltage or a ground voltage.

9. The light sensor circuit as claimed in claim 1, wherein the first transistor includes a first electrode coupled to the selection signal line.

10. The light sensor circuit as claimed in claim 9, wherein the first transistor is an N-type transistor, and the first electrode of the first transistor corresponds to a drain electrode and the second electrode of the first transistor corresponds to a source electrode.

11. The light sensor circuit as claimed in claim 9, wherein the first transistor is a P-type transistor, and the first electrode of the first transistor corresponds to a source electrode and the second electrode of the first transistor corresponds to a drain electrode.

12. The light sensor circuit as claimed in claim 1, wherein the first transistor includes a first electrode coupled to a selection signal line and the gate electrode of the second transistor, wherein a selection signal applied to the selection signal line is adapted to simultaneously be a power voltage to be applied to the first electrode of the first transistor and a control signal to be applied to the gate of the second transistor to control an ON/OFF state of the second transistor.

13. The light sensor circuit as claimed in claim 1, wherein the first power supply is adapted to alternately apply a high-level voltage and a low-level voltage, wherein when the high-level voltage is applied, the light receiving element is in a forward bias state and when the low-level voltage is applied, the light receiving element is in a reverse bias state.

14. A driving method for driving a light sensor circuit, the method comprising:
during a first period of a frame period, applying a first power signal at a high level voltage state thereof to an anode electrode of a light receiving element to store a voltage corresponding to the applied first power signal in a capacitor and initializing a gate electrode of a first transistor based on the voltage of the applied first power signal;
during a second period of the frame period, applying the first power signal at a low-level voltage state thereof to the anode electrode of the light receiving element and discharging the voltage stored in the capacitor based on a voltage applied to the gate electrode of the first transistor based on light leakage current generated according to an amount of light incident on the light receiving element; and
during a third period of the frame period, applying a selection signal having a high level voltage to a selection signal line, the selection signal line being directly coupled to a first electrode of the first transistor and a second transistor, the second transistor being coupled between a second electrode of the first transistor and an output signal line, and finally outputting an output signal having a voltage value based the amount of light incident on the light receiving element.

15. The driving method of the light sensor circuit as claimed in claim 14, further comprising:
maintaining, during a first period of a Kth frame, a final voltage of the output signal of the third period of a (K-1)th frame and performing a sampling process based on the final voltage.

16. The driving method of the light sensor circuit as claimed in claim 14, wherein among the first period, the second period, and the third period of one frame, the second period of the frame is implemented to be a longest in time.

17. The driving method of the light sensor circuit as claimed in claim 14, further comprising:
applying, during a specific period of the second period, a high-level initialization power to a gate electrode of a third transistor to turn on the third transistor and initialize a voltage of an output terminal based on a voltage of a second power supply.

18. The driving method of the light sensor circuit as claimed in claim 14, wherein a first electrode of the first transistor is coupled to the selection signal line and a gate electrode of the second transistor, wherein a selection signal applied to the selection signal line is adapted to simultaneously be a power voltage to be applied to the first electrode of the first transistor and a control signal to be applied to the gate of the second transistor to control an ON/OFF state of the second transistor.

19. A touch screen panel, comprising:
a plurality of selection signal lines that extend along a first direction;
a plurality of output signal lines that extend along a second direction, the first direction crossing with the second direction; and
a plurality of sensor cells that are arranged in respective regions defined by respective portions of the selection signal lines and the output signal lines, each of the sensor cells being coupled to respective ones of the selection signal lines and the output signal lines;
wherein each of the sensor cells includes:
a light receiving element coupled to a first power supply;
a capacitor coupled between the light receiving element and a second power supply;
a first transistor including a gate electrode coupled to a first electrode of the capacitor; and
a second transistor including a gate electrode coupled to a selection signal line, wherein:
the first transistor is coupled between the selection signal line and a first electrode of the second transistor, the selection signal line being directly coupled to a first electrode of the first transistor and the second transistor, and
the second transistor is coupled between a second electrode of the first transistor and an output signal line, wherein the capacitor includes a second electrode coupled to the second power supply, and the first electrode of the capacitor is coupled to a cathode of the light receiving element and the gate electrode of the first transistor.

* * * * *